(12) United States Patent
Sarin et al.

(10) Patent No.: US 8,203,886 B2
(45) Date of Patent: Jun. 19, 2012

(54) MEMORY DEVICE REFERENCE CELL PROGRAMMING METHOD AND APPARATUS

(75) Inventors: Vishal Sarin, Cupertino, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/047,014

(22) Filed: Mar. 14, 2011

(65) Prior Publication Data
US 2011/0205792 A1 Aug. 25, 2011

Related U.S. Application Data

(63) Continuation of application No. 12/236,892, filed on Sep. 24, 2008, now Pat. No. 7,907,444.

(51) Int. Cl.
*G11C 16/06* (2006.01)

(52) U.S. Cl. ........... 365/185.2; 365/185.03; 365/185.28; 365/185.21; 365/185.19; 365/210.14

(58) Field of Classification Search .............. 365/185.2, 365/185.03, 185.28, 185.21, 185.19, 210.14
See application file for complete search history.

(56) References Cited

U.S. PATENT DOCUMENTS

| 7,663,926 B2 | 2/2010 | Sarin et al. |
| 7,830,718 B2 | 11/2010 | Sarin et al. |
| 2008/0094884 A1 * | 4/2008 | Yang et al. ............... 365/158 |
| 2009/0109743 A1 | 4/2009 | Goda et al. |

* cited by examiner

*Primary Examiner* — Thong Q Le
(74) *Attorney, Agent, or Firm* — Leffert Jay & Polglaze, P.A.

(57) ABSTRACT

Memory devices and methods are disclosed, such as those facilitating an assignment scheme of reference cells throughout an array of memory cells. For example, one such assignment scheme assigns reference cells in a staggered pattern by row wherein each column contains a single reference cell. Additional schemes of multiple reference cells assigned in a repeating or a pseudo-random pattern are also disclosed.

25 Claims, 9 Drawing Sheets

MEMORY DEVICE REFERENCE CELL PROGRAMMING METHOD AND APPARATUS

RELATED APPLICATION

This Application is a Continuation of U.S. application Ser. No. 12/236,892 (now U.S. Pat. No. 7,907,444), titled "MEMORY DEVICE REFERENCE CELL PROGRAMMING METHOD AND APPARATUS," filed Sep. 24, 2008, which is commonly assigned and incorporated herein by reference.

TECHNICAL FIELD

The present disclosure relates generally to semiconductor memory and more particularly to non-volatile memory devices.

BACKGROUND

Flash memory devices have developed into a popular source of non-volatile memory for a wide range of electronic applications. Flash memory devices typically use a one-transistor memory cell (e.g., floating gate) that allows for high memory densities, high reliability, and low power consumption. Changes in threshold voltage of the cells, through programming of charge storage trapping layers or other physical phenomena, determine the data state of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a typical NAND type flash memory array architecture 100 wherein the floating gate memory cells 101 of the memory array are logically arranged in a matrix of rows and columns. The memory cells 101 of the array are shown arranged together in strings, typically of 8, 16, 32, or more each, where the memory cells in the string are connected together in series, source to drain, between a common source line 120 and a data line 122, often referred to as a bit line. The array is then accessed by a row decoder activating a row of floating gate memory cells (e.g., 132-138) by selecting a particular access line (e.g., 130), often referred to as a word line, connected to their gates. In addition, bit lines BL0-BL3 122-128 can also be driven high or low depending on the current operation being performed. As is known to those skilled in the art, the number of word lines and bit lines might be much greater than those shown in FIG. 1.

Bit lines BL0-BL3 122-128 are shown coupled to sensing devices (e.g., sense amplifiers) 140-146 that detect the state of each cell by sensing current on a particular bit line 122-128. The word lines WL7-WL0 104-116 and 130 select the individual memory cells 101 in the series strings to be written to or read from and operate the remaining memory cells in each series string in a pass through mode. Each series string of memory cells is coupled to a source line 120 by a source select gate 150 and to an individual bit line BL0 122 by a drain select gate 148, for example. The source select gates, such as 150, are controlled by a source select gate control line SG(S) 118 coupled to their control gates. The drain select gates, such as 148, are controlled by a drain select gate control line SG(D) 102.

As the performance and complexity of electronic systems increase, the requirement for additional memory in systems also increases. However, in order to continue to reduce the costs of the system, it is desirable to keep the parts count low. This can be accomplished by increasing the memory density of an integrated circuit by using such technologies as multilevel cells (MLC). For example, MLC NAND flash memory is a cost effective non-volatile memory.

Multilevel memory cells assign a data state (e.g., as represented by a bit pattern) to a specific range of threshold voltages (Vt) stored on the memory cell. Single level memory cells (SLC) permit the storage of a single bit of data on each memory cell. Meanwhile, MLC technology permits the storage of two or more binary digits (e.g., bits) per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges (e.g., levels) used to represent a bit pattern comprised of N-bits is $2^N$. For example, one bit may be represented by two levels, two bits by four levels, three bits by eight levels, etc. A common naming convention is to refer to SLC memory as MLC(two level) memory as SLC memory utilizes two levels in order to store one bit of data as represented by a 0 or a 1, for example. MLC memory configured to store two bits of data can be represented by MLC(four level), three bits of data by MLC(eight level), etc. An MLC(four level) memory cell is typically referred to as a lower density memory cell than an MLC(eight level) memory due to the lower number of bits stored per memory cell, for example. SLC (e.g., MLC(two level)) is typically referred to as a lower density memory than MLC (four level) memory and so on.

FIG. 2 illustrates an example of Vt distribution 200 for a MLC(four-level) memory cell. For example, a cell may be assigned a Vt that falls within one of four different voltage ranges 202-208 of 200 mV, each being used to represent a data state corresponding to a bit pattern comprised of two bits. Typically, a dead space 210 (which is sometimes referred to as a margin) of 0.2V to 0.4V is maintained between each range to keep the ranges from overlapping. As one example, if the voltage stored on the cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third range 206 of the four Vt ranges would indicate that the cell in this case is storing a logical '00' state. Finally, a Vt residing in the fourth Vt range 208 indicates that a logical '01' state is stored in the cell.

During a typical programming operation of memory cells (e.g. a block) with user data, some additional memory cells are programmed with a known reference value (e.g., reference level.) Over time, the threshold voltages programmed in memory cells, including the reference cells, may drift by some amount. Thus, due to their proximity it is assumed that the amount of drift observed in a reference cell is similar to the amount of drift in a memory cell storing user data. Thus, a determination of how much drift has occurred can be made by comparing the known value programmed into the reference cell with the level actually read from the reference cell. Typically these reference memory cells are arranged such that a complete string comprises memory cells which are all programmed to the same reference level. Additional strings comprise memory cells all programmed to a second reference level, etc.

However, one issue with utilizing this method of determining drift in reference cells is that the resistance of a series string of memory cells varies in response to the programmed pattern (e.g., levels) of the memory cells above and below a target cell in a series string. A change in resistance causes the bit line discharge rate to change, resulting in an error being introduced. This error mechanism is typically referred to as back pattern effect. In the case of strings of reference cells, all of the memory cells above and below each reference cell are programmed to the same level. This is in contrast to strings of memory cells storing user data in that, statistically speaking, the memory cells above and below a particular memory cell (e.g., target cell) store user data that is random. Thus, the user data memory cells experience a different back pattern effect than the reference cells would experience and thereby additional errors between reference and data cells of the array are introduced.

For the reasons stated above, and for other reasons which will become apparent to those skilled in the art upon reading and understanding the present specification, there is a need in the art to manage this back pattern and other effects in reference cells of a memory device.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
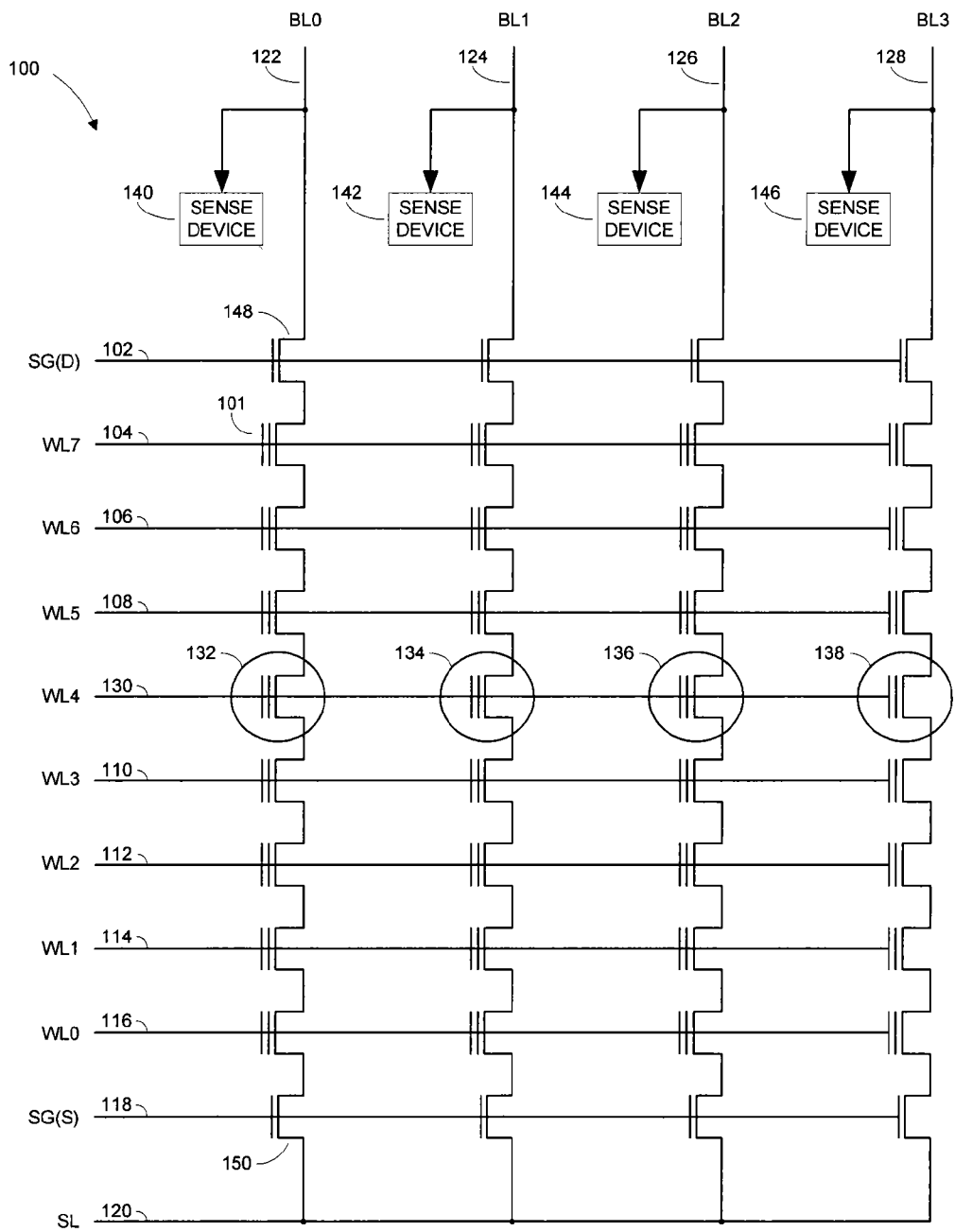
FIG. 1 shows a typical arrangement of multiple series strings of memory cells of a memory array organized in a NAND configuration.
Figure 2:
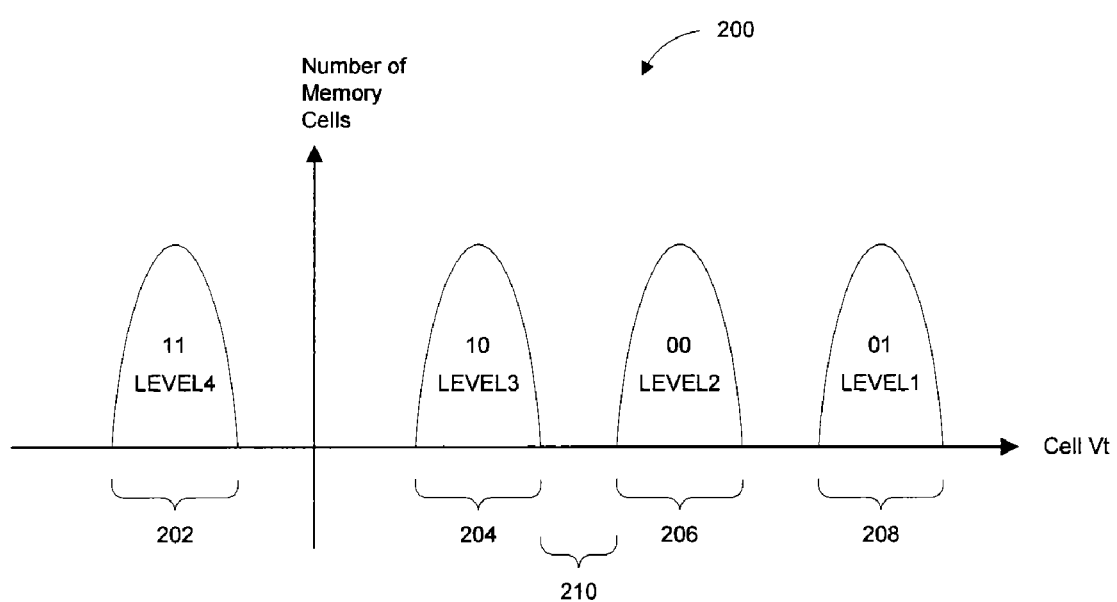
FIG. 2 shows a graphical representation of a threshold voltage distribution in a memory cell.
Figure 3:
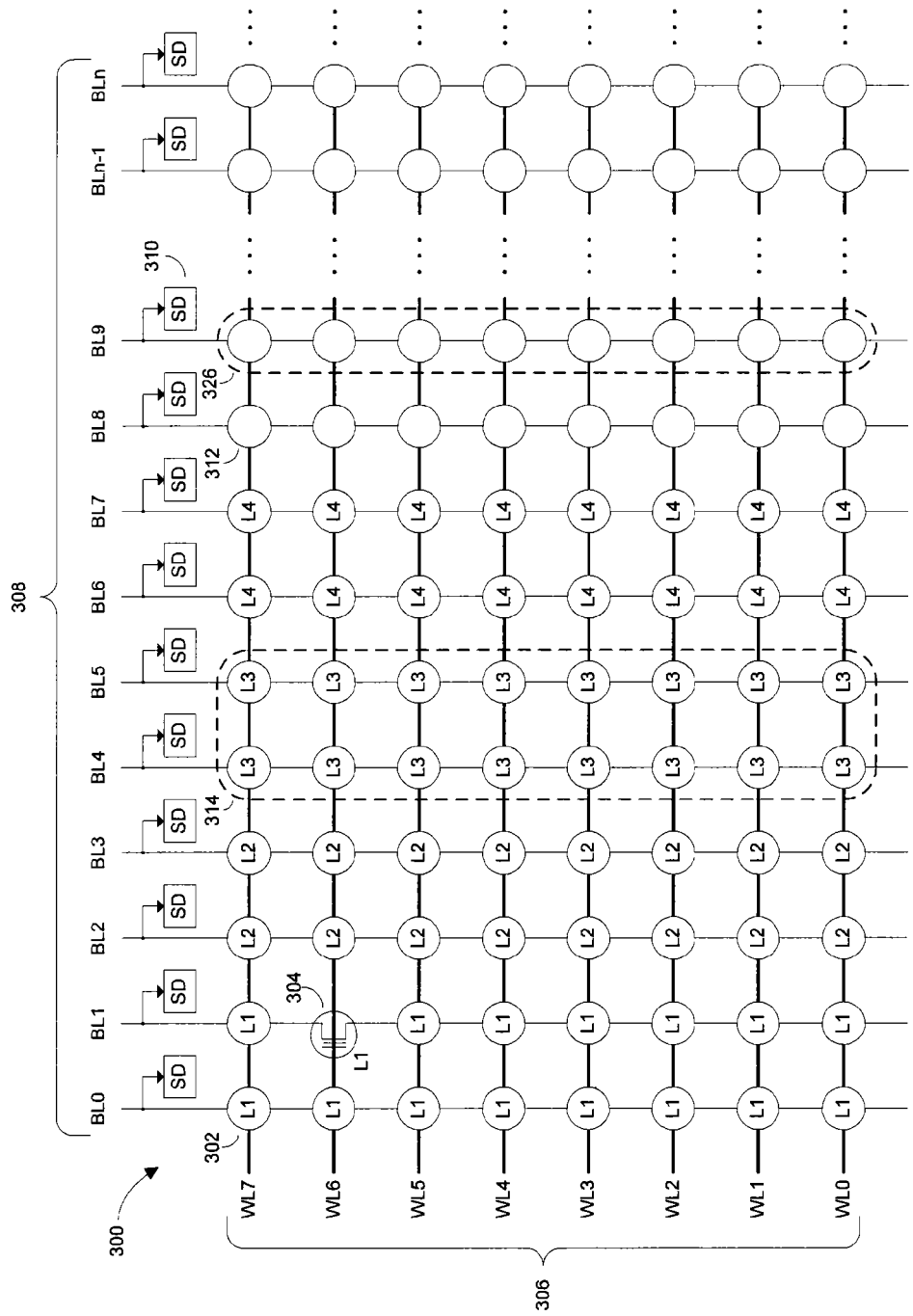
FIG. 3 shows a typical prior art arrangement of reference cells in an array of memory cells.

FIG. 3 illustrates a typical programming scheme for a number of reference cells in an array of memory cells 300. The memory array of FIG. 3 is similar to the memory array illustrated in FIG. 1. The source 120 and drain 102 lines and select gates 150/148 illustrated in FIG. 1 are not shown in FIG. 3 in order to improve the readability of the Figure. In addition, each circle 302 represents a memory cell such as a flash memory cell, for example. Memory cell 304 is shown indicating the schematic representation of a memory cell similar to its depiction in FIG. 1 and the memory cells residing at each of the circled locations 302 of FIG. 3. The example of FIG. 3 illustrates reference cells which have been programmed to one of four levels representing in this example an array of MLC(four level) memory cells. These reference cells are shown programmed to a particular reference level by the designation L1, L2, L3 and L4 corresponding to the ranges 208, 206, 204, 202 depicted in FIG. 2 as discussed above, for example. These reference cells are programmed with a particular level (e.g., reference level) wherein each reference level can represent possible programming levels of memory cells storing user data. Memory cells programmed as reference cells at a given point in time are unavailable to store user data. User data such as provided by a host (e.g., processor), in contrast to reference level data, is programmed into the user data memory cells of the array 300. As shown in FIG. 3, a string of memory cells used for storing user data comprises only memory cells storing user data such as string 326, for example. This is in contrast to the reference cell locations which are reserved to store (e.g., be programmed to) one of the possible reference levels in which a user data memory cell might be programmed to such as L1-L4 as shown in FIG. 3. FIG. 3 further illustrates a number of sense devices (SD) 310 such as those shown in FIG. 1 140-146. Memory cells allocated for storage of user data are indicated in FIG. 3 by empty circles 312, for example. As is known to those skilled in the art, a memory array such as 300 may comprise many more word lines WL7-WL0 306 and bit lines BL0-BLn 308 than are illustrated in FIG. 3.

The programmed reference cells of FIG. 3, as indicated by L1, L2, L3 and L4 designations, are shown to be grouped together in a number of strings (e.g., columns) wherein each column comprises only memory cells which have been assigned a particular reference cell level. For example, the level 3 (L3) reference cells, such as the Level3 range 204 shown in FIG. 2, are shown as two strings of reference cells all having been programmed to the same reference level 314. Although, each group of reference cells of array 300 are shown to comprise two strings of cells such as the group 314, many more similarly programmed strings of cells might exist for each particular reference level.

Figure 4:
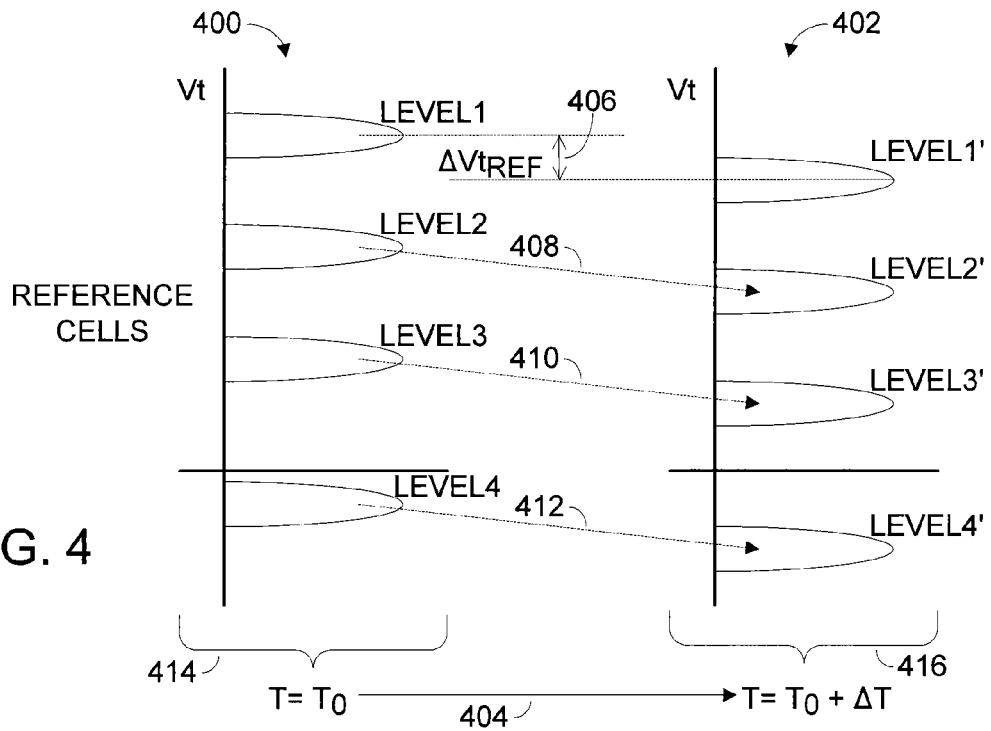
FIG. 4 illustrates a graphical plot of drift of programmed levels over time in an array of memory cells storing reference data.
Figure 5:
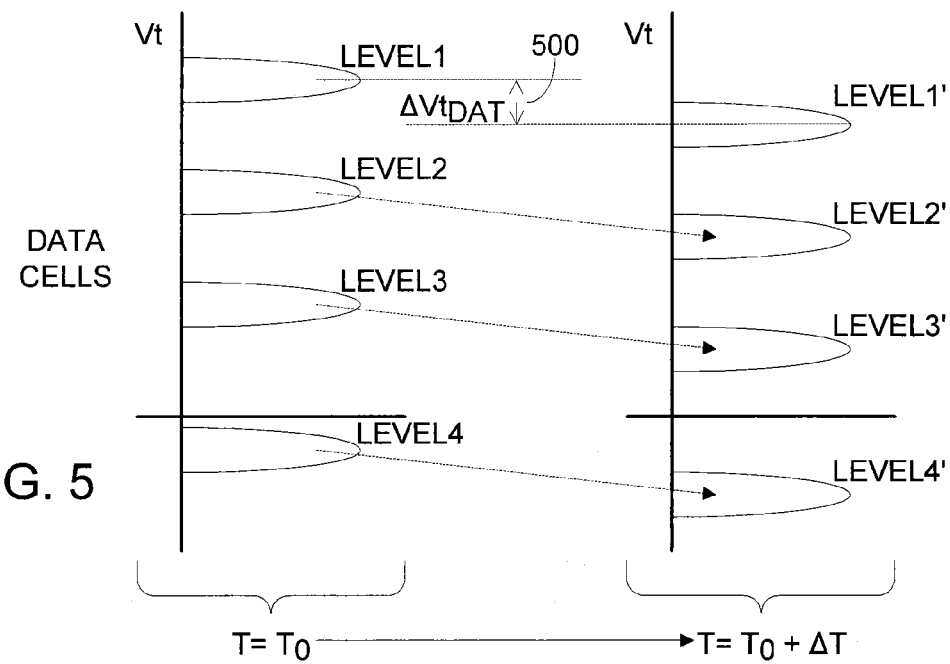
FIG. 5 illustrates a graphical plot of drift of programmed levels over time in an array of memory cells storing user data.

FIGS. 4 and 5 illustrate the potential drift of programmed reference levels and user data levels, respectively, that can occur over time in memory cells such as those described with respect to FIG. 3. With reference to FIG. 4, the reference memory cells, such as 314, are initially programmed to their respective reference levels 414. However, FIG. 4 shows that over some time ($\Delta T$) 404, the threshold levels of programmed reference cells may drift by some amount $\Delta V_{tREF}$ 406-412. FIG. 4 illustrates that the Vt drifts for each level 406-412 are negative and substantially equal, however other shifting directions and magnitudes are possible. As the physical locations and initial programming levels of the reference cells are maintained by control circuitry of the memory device, a measurement can be made of a voltage level of each reference cell after a period of time. Thus, as the initial programming condition (e.g., reference level) is known, a calculation can be made to determine how much memory cells programmed to a particular reference level have drifted. This $\Delta V_{tREF}$ 406 drift is likely to have also occurred to programmed levels of memory cells storing user data, shown as $\Delta V_{tDAT}$ 500 in FIG. 5. As discussed above with respect to FIG. 3, the Vt drift for each reference cell level can be measured. For example, the drift of Level3 reference cells 314/410 can be measured. A detailed discussion of the threshold voltage drift in programmed memory cells is included in U.S. patent application Ser. No. 11/881,423 ('423 application) filed Jul. 27, 2007 and titled, "Cell Deterioration Warning Apparatus and Method," which is commonly assigned.

However, another error mechanism can also occur that can, at least partially, corrupt the estimated correlation between the $\Delta V_{tREF}$ 406 and $\Delta V_{tDAT}$ 500 drift. This error mechanism is commonly referred to as back pattern effect. The back pattern effect experienced by a particular cell in a string (e.g., a target cell) is dependent on the programmed levels of the memory cells above and below the target cell in the same string of memory cells. For example, in the case of strings (e.g., NAND strings) of reference cells such as those shown in FIG. 3, all of the memory cells above and below each reference cell are programmed to the same level, such as Level3 in the group 314, for example. This is in contrast to strings of memory cells storing user data, such as string 326 in that, statistically speaking, the memory cells above and below a particular memory cell (e.g., target cell) in a string of memory cells storing user data 326 is random. Thus, the memory cells programmed with user data experience a different back pattern effect than the reference cells experience. This introduces additional errors between values for reference and data cells of the array. A detailed discussion of back pattern effect is included in U.S. patent application Ser. No. 11/943,729 ('729 application) filed Nov. 21, 2007 and titled, "Mitigation of Data Corruption From Back Pattern and Program Disturb in a Non-Volatile Memory Device," which is commonly assigned.

Figure 6:
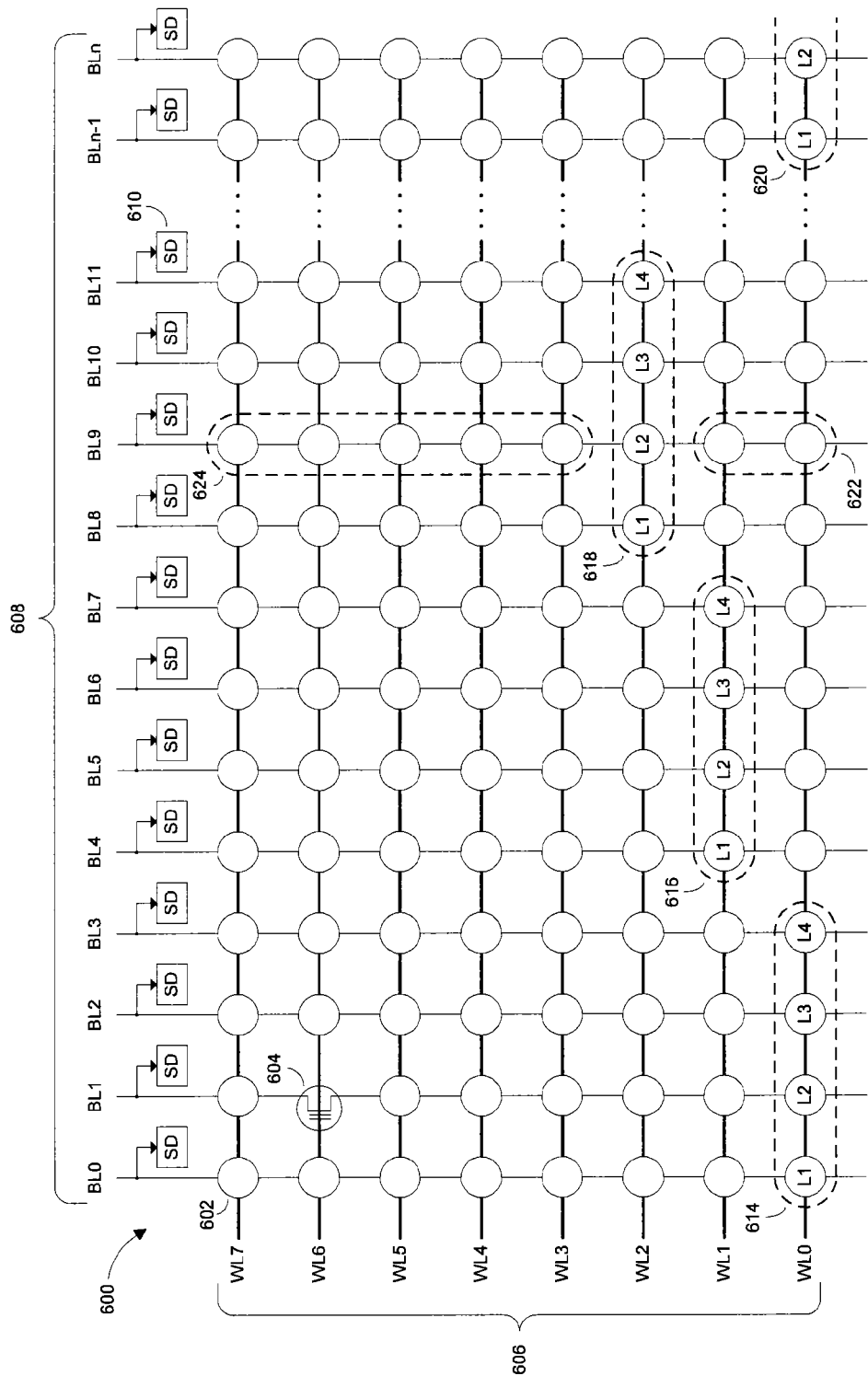
FIG. 6 shows an arrangement of reference cells in an array of memory cells according to an embodiment of the present disclosure.

FIG. 6 illustrates a reference cell assignment scheme according to one or more embodiments of the present disclosure. FIG. 6 illustrates an array 600 of memory cells 604 arranged in columns 608 (e.g., NAND strings) and rows 606. It should be noted that the columns and rows as shown in FIG. 6 should not be interpreted to require any particular linear relationship or orientation. They are shown to imply a logical relationship of memory cells according one or more embodiments of the present disclosure that can include a perpendicular arrangement of rows and columns as shown in FIG. 6, for example. The memory cells of array 600 are in one embodiment MLC memory cells adapted to store four levels (e.g., 2 bits) per memory cell. However, the various embodiments are not limited to memory cells storing four levels. Cell 604 is shown as a schematic representation of the memory cells 602 of the array 600 such as those shown in FIG. 1, for example. The array of FIG. 6 has also been simplified to focus on the memory cell locations 600 of the array and not the exact schematic representation of each memory cell of the array. Sensing devices 610 for each column 608 are illustrated in FIG. 6, however source and drain select gates, such as 150 and 148 shown in FIG. 1, are not shown in FIG. 6 to improve readability of the Figure.

As discussed above, the back pattern effect is at least partially dependent upon the programmed levels of memory cells above (e.g., closer to the drain select gate, not shown) and below (e.g., closer to the source select gate, not shown) a particular target cell whether it is programmed as a reference cell or a user data cell. Thus, according to one or more embodiments of the present disclosure, reference cells, designated by their respective reference levels (e.g., L1, L2, L3, L4) as shown in FIG. 6, are assigned, either predetermined or dynamically, to locations in the memory array 600 by a controller or other control circuitry of the memory device such that the back pattern effect experienced by each reference cell is statistically equivalent to the back pattern effect experienced by a user data cell. An example of such control circuitry is discussed subsequently with respect to FIG. 12.

According to one or more embodiments of the present disclosure, each group 614-620 of reference cells are located in a staggered location relative to other groups of reference cells. For example, a first group of reference cells 614 are coupled to word line WL0. A second group of reference cells 616 are coupled to the next word line WL1. In addition to the staggered location by row of the groups of reference cells 614-620, the reference cells are also located such that only one reference cell is located in each column of memory cells. For example, the group of reference cells 614 share the same row but do not share the same column. According to one or more embodiments, this staggered location of groups of cells continues until a group of reference cells occupies each row of the array 600. At such point, the staggered pattern repeats and reference cells 620 are assigned to the first row WL0. The staggered location of groups of reference cells, such as 614-618, is then repeated for a particular number of groups of reference cells. The memory device control circuitry keeps track of the locations of reference cells and programs user data to the remaining memory cells of each column not occupied by a reference cell, such as the group of memory cells 622/624, for example.

Reference cells 614-620 grouped and arranged in the manner illustrated by FIG. 6 are still exposed to a back pattern effect while each string of memory cells are programmed. However, as discussed above, each reference cell being programmed to one of each possible reference levels (e.g., L1, L2, L3, L4) will have user data programmed above it and below it 622/624 according to the various embodiments of the present disclosure. Reference cells programmed on the highest and lowest wordlines (e.g., WL7, WL0) will only have user data programmed below and above the reference cell, respectively. Statistically speaking, as the user data programmed throughout the array of memory cells 600 will be essentially random, the reference cells 614-620 placed throughout the user data locations of memory array 600 will also experience programming conditions more closely approximating the conditions experienced (e.g., back pattern effect) by the user data memory cells. Again, this is in contrast to the scheme of exclusively locating reference cells in multiple strings wherein each of the memory cells of each string have the same programmed reference level such as discussed with respect to and shown in FIG. 3. Thus, such embodiments of the present disclosure provide for reference cells and user data cells that are more closely programmed to each particular possible programming level such as the programming levels associated with MLC(two level), MLC(three level) and MLC(four level) memory, for example.

Figure 7:
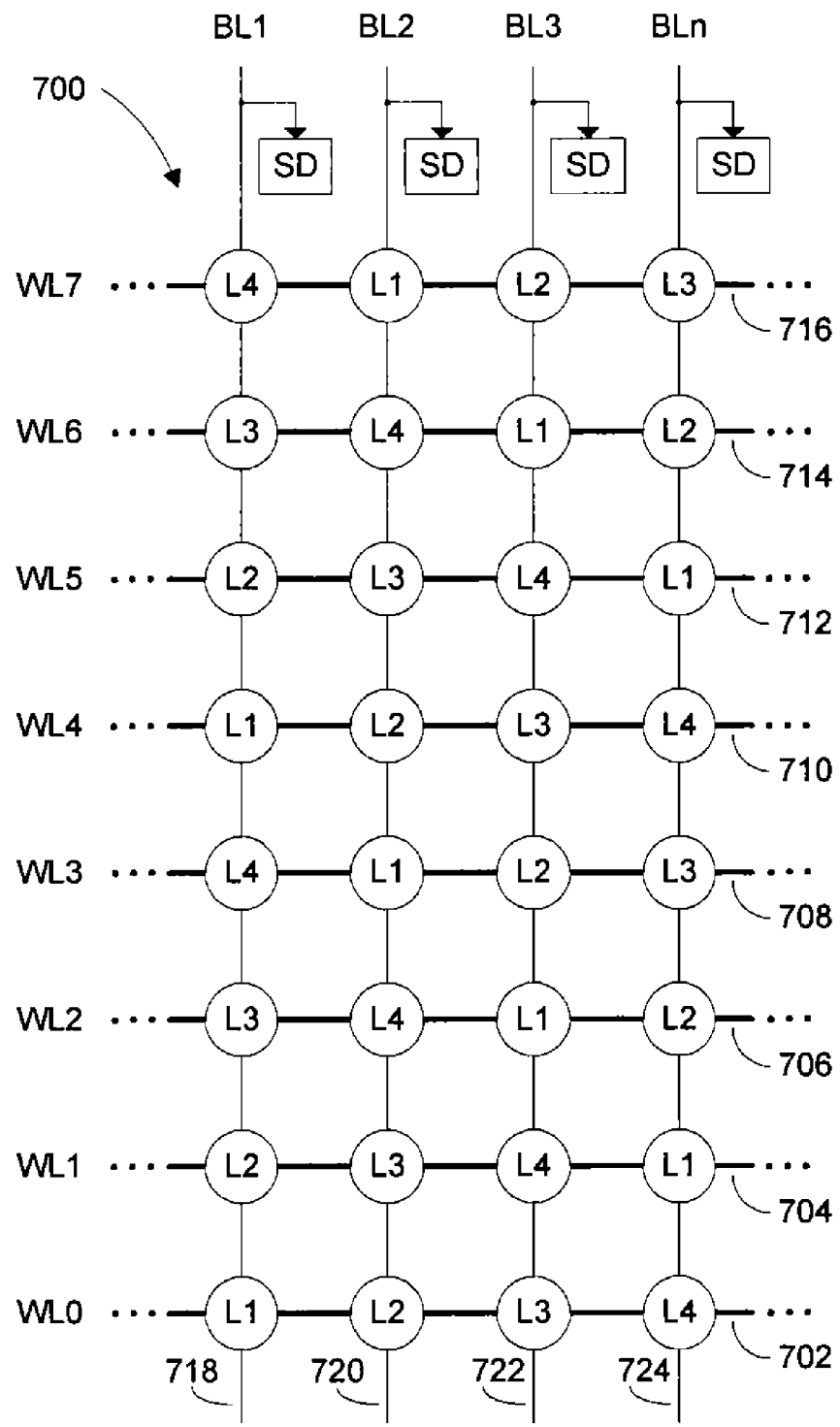
FIG. 7 shows an arrangement of reference cells in an array of memory cells according to an embodiment of the present disclosure.

Limiting the assignment of reference cells to one reference cell per column of memory cells, such as shown in FIG. 6, can improve the statistical probability of essentially random data being stored along with each reference cell in each column of memory cells. However, the various embodiments of the present disclosure are not limited to having a single reference cell per column and/or to the staggered pattern of reference cells 614-620 as illustrated in FIG. 6. For example, FIG. 7 illustrates an array of memory cells arranged in rows (e.g., word lines) 702-716 and columns (e.g., bit lines) 718-724 similar to those shown in FIG. 6. FIG. 7 further illustrates that complete strings on memory cells might be programmed as reference cells according to one or more embodiments of the present disclosure. However, the pattern of the assignment of the reference cells shown in FIG. 7 is distinguishable from those of FIG. 3 discussed above. The reference cells of FIG. 7 are assigned to locations such that any given reference cell 700 of any given column will be exposed to the effects of the remaining memory cells of the string being programmed to the various possible reference levels. Thus, the assignment scheme according to one or more embodiments of the present disclosure and illustrated by FIG. 7 effectively exposes each reference cell to the effects (e.g., back pattern effects) they would experience if the particular reference cell were programmed along with user data such as in a manner as illustrated by FIG. 6.

It is shown in FIG. 7 that for each row and column there is a sequential pattern of reference levels programmed into the reference cells. According to the various embodiments, there may be many more rows and columns than those shown in FIG. 7. Additionally, according to one or more embodiments, the reference cells of each column of FIG. 7 might comprise an approximately equal number of reference cells programmed to each of the possible programming levels. It is also shown in FIG. 7 that given a particular row, the sequential pattern of programmed reference cells is shifted by one location with respect to the rows above and below the particular row. By way of example, WL4 710 shows a row of four reference cells programmed sequentially each to one of four reference levels (e.g., L1, L2, L3, L4). The array 700 of memory cells illustrated in FIG. 7 are in one embodiment MLC memory cells configured to store one of four programmed levels such as those stored for data representing two bits of data, for example. However, the various embodiments are not limited to MLC memory cells storing four levels (e.g., two bits) of data. Again with reference to WL4 710, it is shown in FIG. 7 that WL5 712 of memory cells immediately above WL4 710 are also programmed sequentially by row to reference levels L1, L2, L3 and L4. However, the reference cells of WL5 712 are assigned such that each reference cell programmed to each reference level is shifted (e.g., offset) by one column to that of a similarly programmed reference cell of WL4 710 immediately below WL5 712. For example, the WL4 reference cell of column 718 is programmed to a L1 reference level. The WL5 reference cell of column 718, is shown programmed to a L2 reference level. This pattern repeats throughout the array of memory cells 700. It should be noted that as shown in FIG. 7 that the repeating offset patterns also appear with respect to adjacent rows as wells as columns. It should also be noted that the various embodiments of the present disclosure are not limited to an assignment pattern of shifting a sequential pattern of reference cells by one column for each adjacent row as illustrated by FIG. 7. For example, each column 718-724 may comprise a pseudo-random programming of reference cells to the possible reference levels (e.g., L1, L2, L3, L4) along each string according to one or more embodiments. Rows and/or columns of repeating sequences may also be shifted by more than one row and/or column according to one or more embodiments of the present disclosure, for example. Although not shown in FIG. 7, additional embodiments of the present disclosure might utilize a different sequence (e.g., as opposed to shifting the same pattern of each adjacent column) of reference cells along each particular column than those in an adjacent column, for example.

Figure 8:
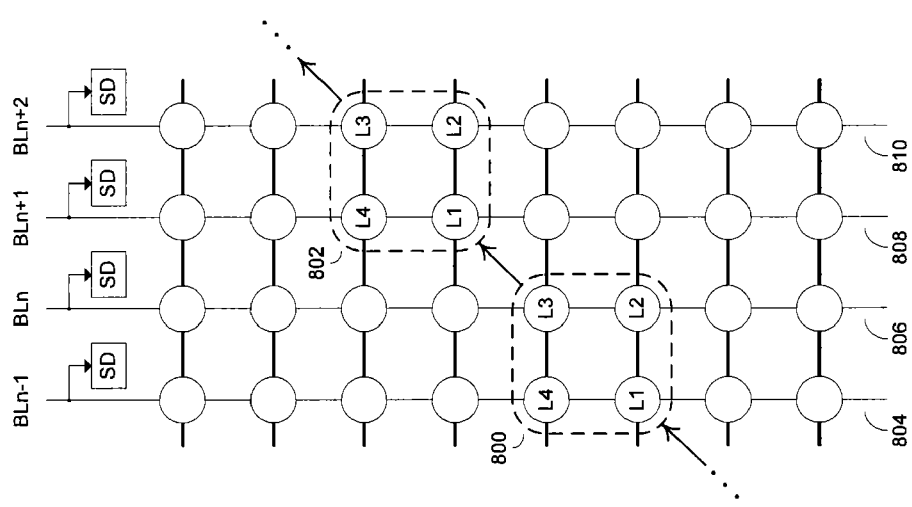
FIG. 8 shows another arrangement of reference cells in an array of memory cells according to an embodiment of the present disclosure.

FIG. 8 also illustrates an assignment scheme for reference cells with more than one possible reference programming level (e.g., L1, L2, L3, L4) according to one or more embodiments of the present disclosure. The assignment of reference cell groups 800-802 are each shown having one cell of each group 800-802 programmed to one of four reference programming levels. Although, each column 804-810 of FIG. 8 is shown having programmed reference cells, various embodiments of the present disclosure are not so limited. For example, one or more embodiments might comprise columns of cells 804-810 not having reference cells and/or groups of reference cells, such as groups 800-802. Although not shown in FIG. 8, one or more columns of cells 804-810 not having programmed reference cells (e.g., cells programmed as user data cells) might exist between columns 806 and 808, for example. Again as in FIG. 6, the empty circles of FIG. 8 illustrate memory cell locations designated, either dynamically or permanently, as user data memory cells. Reference cell locations assigned throughout the array of memory cells may also be dynamically or permanently designated according to the various embodiments of the present disclosure.

Figure 9:
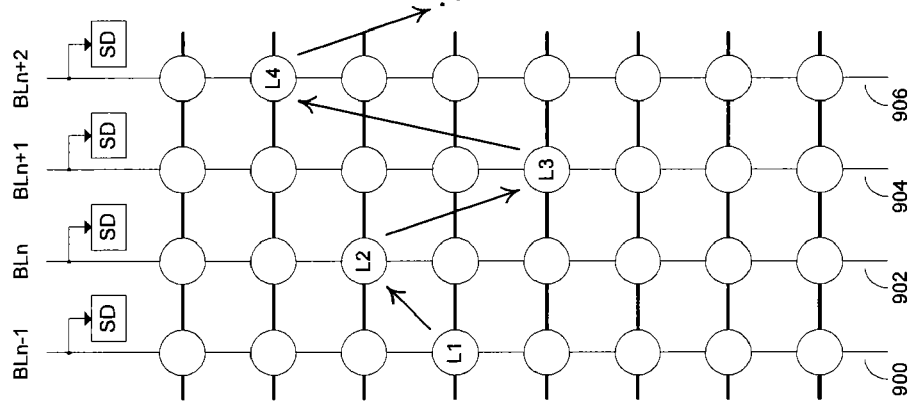
FIG. 9 shows another arrangement of reference cells in an array of memory cells according to an embodiment of the present disclosure.

FIG. 9 illustrates an alternate assignment pattern of reference cells 900-906 again having four possible reference levels (e.g., L1, L2, L3, L4) according to one or more embodiments of the present disclosure. Again, empty circles shown in the array of cells are those designated as user data memory cells. Additional embodiments might also have columns 900-906 not having any programmed reference cells interspersed between columns having reference cells. For example, one or more columns of cells might exist between columns 902 and 904 for example that do not have any cells programmed as reference cells (not shown). The various embodiments are not limited to memory cells having only four reference(L1, L2, L3, L4) and/or programming levels as shown in FIGS. 8 and 9.

Figure 10:
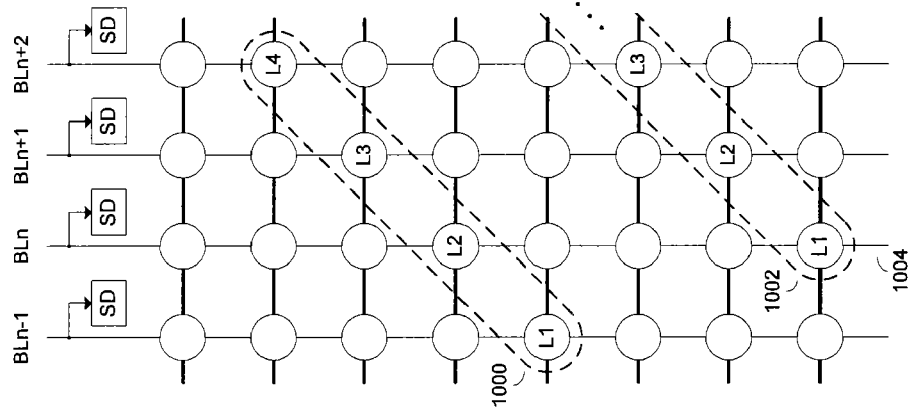
FIG. 10 shows another arrangement of reference cells in an array of memory cells according to an embodiment of the present disclosure.

FIG. 10 illustrates yet another assignment scheme of reference cells 1000-1002 according to one or more embodiments of the present disclosure. The reference and user data memory cells of FIG. 10 have four possible programming levels (e.g., L1, L2, L3, L4). FIG. 10 illustrates further that a single column 1004 may comprise two reference cells each having different reference levels. Although FIGS. 8 and 10 illustrate two reference cells per column, the various embodiments are not so limited and can comprise more than two reference cells per column. In addition, FIGS. 8, 9 and 10 are intended to illustrate various possible examples of assignments of reference cells according to one or more embodiments of the present disclosure. The various embodiments however are not limited to the arrangements illustrated in these Figures, by the number of rows and columns, or by the number of memory cells shown in the Figures. As is known to those skilled in the art, many more rows, columns and memory cells can be present in a memory array, and additional assignment patterns for reference cells are within the scope of the embodiments.

Figure 11:
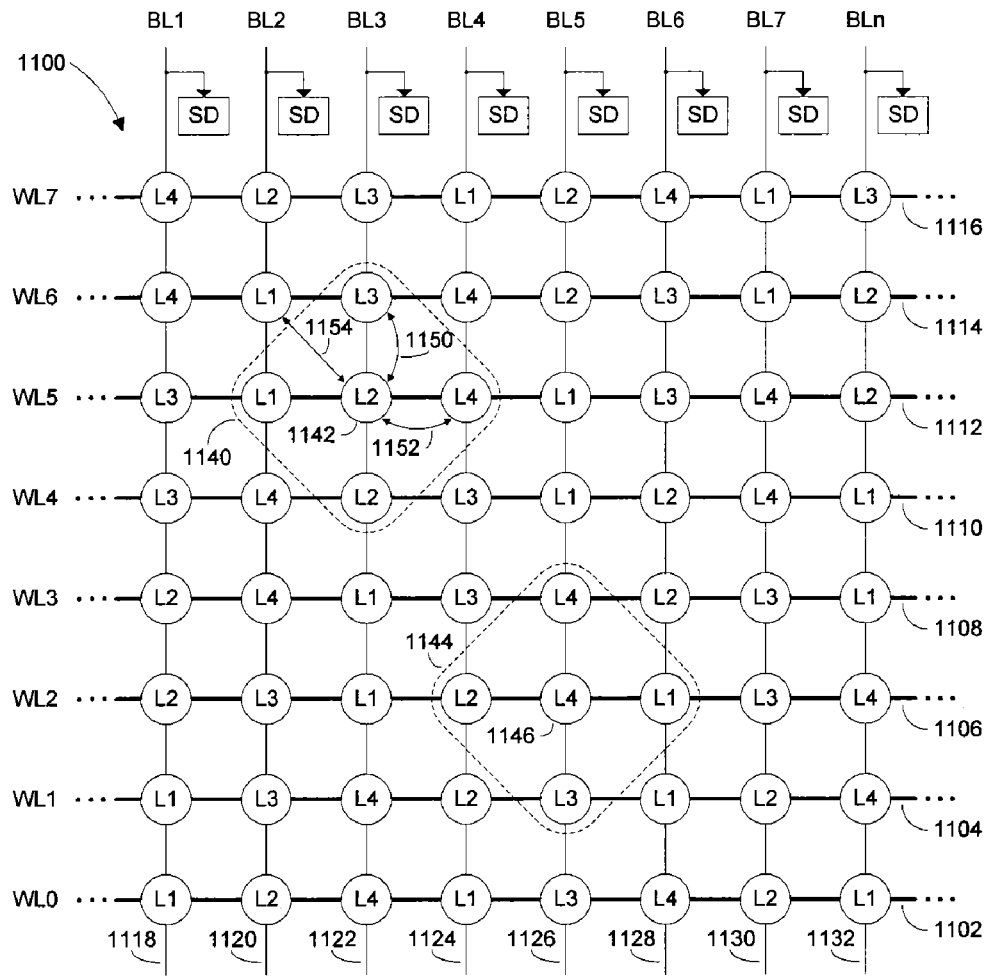
FIG. 11 shows an additional arrangement of reference cells in an array of memory cells according to an embodiment of the present disclosure.

FIG. 11 illustrates an array of memory cells 1100 arranged in rows (e.g., word lines) 1102-1116 and columns (e.g., bit lines) 1118-1132 similar to those shown in FIGS. 6 and 7. The reference cells of the array of memory cells 1100 are shown arranged in a pattern with each cell having one of four (e.g., L1, L2, L3, L4) reference levels. However, additional embodiments of the present disclosure might utilize more or less reference cell levels than the four levels shown in FIG. 11. FIG. 11 also illustrates that complete strings on memory cells might be programmed as reference cells according to one or more embodiments of the present disclosure. The reference cells of FIG. 11 are assigned to locations such that any given reference cell 1100 of any given column will be exposed to the effects of the remaining memory cells of the string being programmed to the various possible reference levels. Thus, the assignment scheme according to one or more embodiments of the present disclosure and illustrated by FIG. 11 effectively exposes each reference cell to the effects (e.g., back pattern effects) it would experience if the particular reference cell were programmed along with user data such as in a manner as illustrated by FIGS. 6 and 7. It should be noted that for a given group of reference cells (e.g., 1144, 1140), a particular reference cell (e.g., 1142, 1146) is surrounded by (e.g., adjacent to) a reference cell programmed to each of the possible reference levels. For example, L4 reference cell 1146 of group 1144 is adjacent to an L1, L2, L3 and L4 programmed reference cell.

In addition to back pattern effects, another effect can occur which is commonly referred to as floating gate coupling effect. Typically this effect is referred to as vertical coupling (e.g., 1150), horizontal coupling (e.g., 1152) and diagonal coupling (e.g., 1154). However, the terminology is used to conveniently describe the effect on nearby cells and is not necessarily limited to any fixed orientation as indicated by arrows 1150, 1152 and 1154 of FIG. 11. Typically, diagonal floating gate coupling effects 1154 tend to contribute less of an effect than vertical 1150 and/or horizontal 1152 coupling effects introduce with respect to nearby (e.g., adjacent) cells. The effects of floating gate coupling can introduce errors into memory cells (e.g., reference cells) during and/or after each cell has been programmed (e.g., either as reference or data cells). As discussed above, the reference cell arrangement scheme according to one or more embodiments of the present disclosure shown in FIG. 11 results in a particular reference cell, such as cell 1146, being surrounded by (e.g., adjacent to) a reference cell programmed to each of the possible reference levels, such as L1-L4 of group 1144. The programming level (e.g., reference level) programmed into a cell can influence the amount of floating gate coupling effect that occurs with respect to the programming of nearby cells. Thus, the reference cell arrangement scheme illustrated by FIG. 11 further serves to expose a particular reference cell, such as 1146/1142, to varying degrees of floating gate coupling effects by way of being surrounded by reference cells programmed to each of the possible reference levels, such as shown in groups 1144 and 1140, for example. Thus, this arrangement of reference cells according to one or more embodiments of the present disclosure as illustrated by FIG. 11 further serves to address back pattern as well as floating gate coupling effects, such as those caused by the typical random distribution of programming levels of memory cells programmed as data cells, for example.

FIGS. 6, 7, 8, 9, 10 and 11 each illustrate a substantially fixed (e.g., repeating) pattern of reference cell location assignment, however the various embodiments are not so limited. For example, a pseudo-random assignment algorithm may be utilized in one embodiment to distribute the reference cells having various reference levels throughout an array of cells such as to statistically achieve the same dispersal and exposure to various degrees of back pattern effect by reference cells throughout the array as those distributed by a fixed pattern of reference cell assignment as shown in FIGS. 6, 7, 8, 9, 10 and 11. As discussed previously, control circuitry in the memory device according to one or more embodiments generates and/or maintains the locations of the pseudo-random assignment of the reference cells distributed throughout the array of memory cells. The methods according to the various embodiments of the present disclosure can provide each given reference cell with exposure to statistically random programmed cells, either as reference or user data cells, located in the general vicinity of each given reference cell and thereby more closely mirror the resulting back pattern effect of statistically random data. Thus, the reference levels programmed into the reference cells will more accurately resemble the levels programmed into the user data cells according to the various embodiments of the present disclosure.

Figure 12:
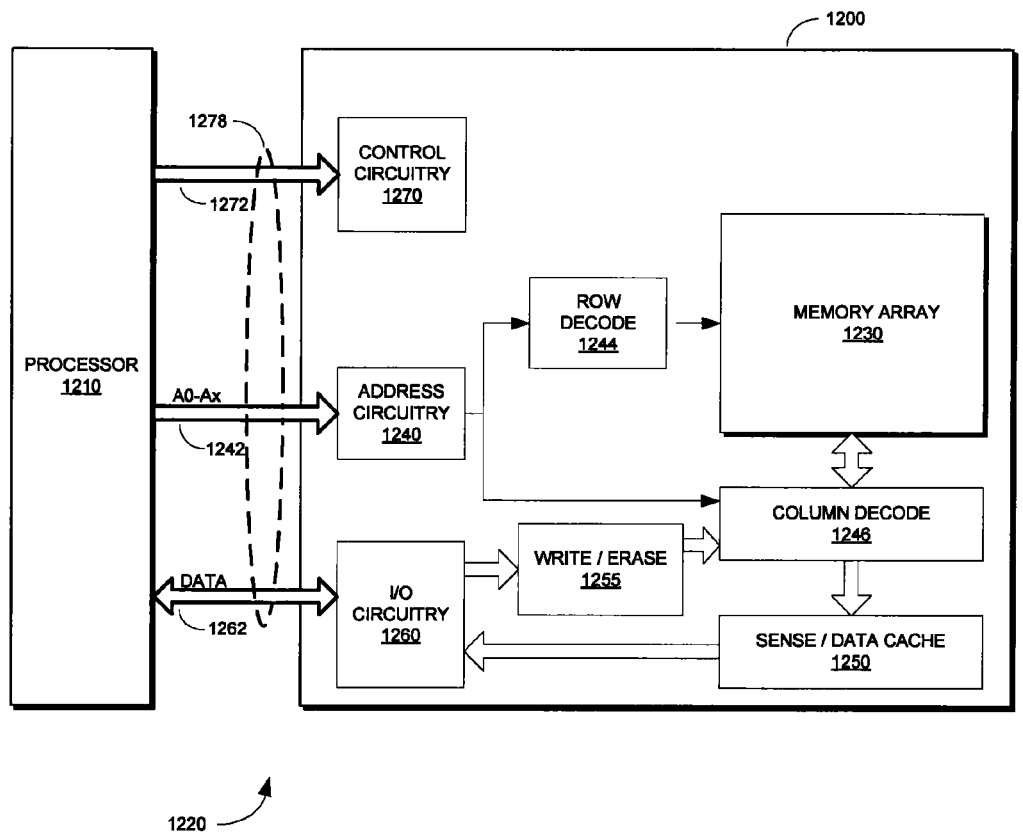
FIG. 12 shows a block diagram of one embodiment of a memory system that incorporates the back pattern compensation of the present disclosure.

FIG. 12 is a functional block diagram of an electronic system having at least one memory device according to one or more embodiments of the present disclosure. The memory device 1200 illustrated in FIG. 12 is coupled to a processor 1210. The processor 1210 may be a microprocessor or some other type of controlling circuitry. The memory device 1200 and the processor 1210 form part of an electronic system 1220. The memory device 1200 has been simplified to focus on features of the memory device that are helpful in understanding the embodiments of the present disclosure.

The memory device 1200 includes an array of memory cells 1230 that can be arranged in banks of rows and columns. Memory array 1230 may comprise SLC and/or MLC memory, for example. According to one or more embodiments, these memory cells of memory array 1230 are flash memory cells. The memory array 1230 can consist of multiple banks and blocks of memory cells. The memory cells of the memory array 1230 may also be adaptable to store varying densities (e.g., MLC(four level) and MLC(eight level)) of data in each cell.

An address buffer circuit 1240 is provided to latch address signals provided on address input connections A0-Ax 1242. Address signals are received and decoded by a row decoder 1244 and a column decoder 1246 to access the memory array 1230. It will be appreciated by those skilled in the art, with the benefit of the present description, that the number of address input connections depends on the density and architecture of the memory array 1230. That is, the number of addresses increases with both increased memory cell counts and increased bank and block counts, for example.

The memory device 1200 reads data in the memory array 1230 by sensing voltage or current changes in the memory array columns using sense/data cache circuitry 1250. The sense/data cache circuitry 1250 according to at least one embodiment, is coupled to read and latch a row of data from the memory array 1230. Data input and output buffer circuitry 1260 is included for bi-directional data communication over a plurality of data connections 1262 with the processor 1210. Write circuitry 1255 is provided to write data to the memory array 1230.

Control circuitry 1270 is configured in part to implement the methods of the various embodiments of the present disclosure. In at least one embodiment, the control circuitry 1270 may utilize a state machine Control signals and commands can be sent by the processor 1210 to the memory device 1200 over the command bus 1272. The command bus 1272 may be a discrete signal or may be comprised of multiple signals, for example. These command signals 1272 are used to control the operations on the memory array 1230, including data read, data write (program), and erase operations. The command bus 1272, address bus 1242 and data bus 1262 may all be combined or may be combined in part to form a number of standard interfaces 1278. For example, the interface 1278 between the memory device 1200 and the processor 1210 may be a Universal Serial Bus (USB) interface. The interface 1278 may also be a standard interface used with many hard disk drives (HDD.) For example, the interface may take the form of an SATA or PATA interface. Other interfaces are known to those skilled in the art.

The electronic system illustrated in FIG. 12 has been simplified to facilitate a basic understanding of the features of the memory and is for purposes of illustration only. A more detailed understanding of internal circuitry and functions of non-volatile memories are known to those skilled in the art.

CONCLUSION

Various embodiments of the present disclosure provide methods for assigning and organizing the programming of reference cells in a memory device. Also disclosed are apparatus configured to perform the various assigning and programming methods of reference cells in a memory device according to the various embodiments of the present disclosure.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming reference cells in an array of memory cells logically arranged in rows and columns, the method comprising:
   programming one or more reference memory cells of a first column of memory cells to a first reference level;
   programming one or more reference memory cells of a second column to a second reference level;
   wherein the first reference level is different than the second reference level; and
   wherein one or more memory cells of the first column are not programmed to the first reference level.

2. The method of claim 1, wherein one or more memory cells of the second column are not programmed to the second reference level.

3. The method of claim 1, further comprising programming one or more memory cells of the second column with user data.

4. The method of claim 3, further comprising programming one or more memory cells of the first column with user data.

5. The method of claim 1, further comprising programming one or more reference cells of the first column to the second reference level.

6. The method of claim 1, further comprising programming a third column of memory cells only as user data memory cells wherein the third column is located between the first column and the second column.

7. A method of programming memory cells in an array of memory cells logically arranged in rows and in columns, the method comprising:
   programming a first memory cell of a particular row and a particular column as a reference memory cell programmed to a first reference level;
   programming a second memory cell of the particular row to a second level; and
   programming a third memory cell of the particular column to a different level than the first memory cell.

8. The method of claim 7, wherein programming the second memory cell further comprises programming the second memory cell as a reference memory cell.

9. The method of claim 7, wherein programming the second memory cell further comprises programming the second memory cell as a user data memory cell.

10. The method of claim 9, wherein programming the third memory cell further comprises programming the third memory cell as a user data memory cell.

11. The method of claim 7, wherein programming the third memory cell further comprises programming the third memory cell as a reference memory cell.

12. The method of claim 7, wherein programming a third memory cell further comprises programming the third memory cell as a user data memory cell.

13. A memory device, comprising:
   an array of memory cells logically arranged in rows and columns; and
   control circuitry, wherein the control circuitry is configured to program a first memory cell of a particular row and a particular column as a reference cell programmed to a first reference level, program a second memory cell of the particular row to a second level, and program a third memory cell of the particular column to a different level than the first memory cell.

14. The memory device of claim 13, wherein the second memory cell is programmed as a reference cell and where the second level comprises a second reference level.

15. The memory device of claim 14, wherein the third memory cell is programmed as a user data memory cell.

16. The memory device of claim 13, wherein the third memory cells is programmed as a reference cell and the different level comprises a reference level different than the first reference level.

17. The memory device of claim 16, wherein the second memory cell is programmed as a user data memory cell.

18. The memory device of claim 13, wherein the control circuitry is further configured to assign a location of the first memory cell programmed as a reference cell.

19. The memory device of claim 18, wherein the control circuitry is further configured to one of dynamically assign or permanently assign the location of the first memory cell programmed as a reference cell.

20. The memory device of claim 13, wherein the control circuitry is further configured to track locations of memory cells programmed as reference cells and to program memory cells other than reference cells with user data.

21. The memory device of claim 13, wherein the array of memory cells comprises an array of single level and/or multi level FLASH memory cells.

22. A memory device, comprising:
   an array of memory cells logically arranged in rows and columns; and
   control circuitry, wherein the control circuitry is configured to program one or more reference memory cells of a first column to one of a plurality of reference levels, and program one or more reference memory cells of a second column to one of the plurality of reference levels;
   wherein the first and the second column each comprise an approximately equal number of reference memory cells programmed to each of the plurality of reference levels; and
   wherein at least one reference cell of each of the first and the second columns are programmed to a different level than at least one other memory cell of the first and the second columns, respectively.

23. The memory device of claim 22, wherein the control circuitry is further configured to program the reference memory cells of the first and the second column in a pseudo-random distribution.

24. The memory device of claim 22, wherein the control circuitry is further configured to one of dynamically assign or permanently assign locations of the reference memory cells of the first and the second columns.

25. The memory device of claim 22, wherein the control circuitry is further configured to program user data in memory cells of the first and second columns other than the reference memory cells of the first and the second columns.

* * * * *